(12) United States Patent
Roessl et al.

(10) Patent No.: US 8,373,134 B2
(45) Date of Patent: Feb. 12, 2013

(54) ELECTRICAL ISOLATION OF X-RAY SEMICONDUCTOR IMAGER PIXELS

(75) Inventors: Ewald Roessl, Ellerau (DE); Roland Proksa, Neu Wulmstorf (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 155 days.

(21) Appl. No.: 12/809,079

(22) PCT Filed: Dec. 26, 2008

(86) PCT No.: PCT/IB2008/055539
§ 371 (c)(1),
(2), (4) Date: Oct. 13, 2010

(87) PCT Pub. No.: WO2009/083920
PCT Pub. Date: Jul. 9, 2009

(65) Prior Publication Data
US 2011/0019794 A1   Jan. 27, 2011

(30) Foreign Application Priority Data

Dec. 28, 2007  (CN) .......................... 2007 1 0306621

(51) Int. Cl.
*H01L 27/146* (2006.01)
(52) U.S. Cl. ................ 250/370.09; 250/370.01
(58) Field of Classification Search ............ 250/370.09, 250/370.01
See application file for complete search history.

(56) References Cited

U.S. PATENT DOCUMENTS

| | | | |
|---|---|---|---|
| 4,055,766 A * | 10/1977 | Miller et al. ............ | 250/370.09 |
| 5,619,033 A | 4/1997 | Weisfield | |
| 6,236,051 B1 | 5/2001 | Yamakawa et al. | |
| 6,292,528 B1 | 9/2001 | Wieczorek et al. | |
| 7,968,959 B2 * | 6/2011 | Christophersen et al. ..... | 257/429 |
| 8,110,809 B2 * | 2/2012 | Amano ................... | 250/370.09 |
| 2005/0247882 A1 | 11/2005 | Wear et al. | |
| 2007/0085117 A1 | 4/2007 | Wilson et al. | |
| 2007/0206721 A1 | 9/2007 | Tkaczyk et al. | |

FOREIGN PATENT DOCUMENTS

| | | |
|---|---|---|
| DE | 3836835 A1 | 10/1988 |
| EP | 1326278 A1 | 7/2003 |
| JP | 60124879 | 7/1985 |
| JP | 60124879 A * | 7/1985 |
| JP | 01172792 | 7/1989 |
| WO | 9847181 A1 | 10/1998 |
| WO | 2004021456 A2 | 3/2004 |
| WO | 2007031886 A2 | 3/2007 |
| WO | WO 2007125862 A1 * | 11/2007 |

* cited by examiner

*Primary Examiner* — Christine Sung

(57) ABSTRACT

To mitigate the influence of charge sharing occurring in semiconductor detectors, an improved semiconductor detector (200) is provided, which comprises: a plurality of anodes (210) arranged to form at least one opening (230), each opening being formed by two anodes in the plurality of anodes; at least one cathode (220); a detector cell (240) located between the plurality of anodes and the at least one cathode; wherein the detector cell comprises at least one groove (250), each of the at least one groove having a first opening (252) aligned with one of the at least one opening being formed by two anodes in the plurality of anodes, each of the at least one groove extending towards the at least one cathode. By forming grooves in the detector cell, the charge cloud generated by a single photon can be received by a corresponding anode instead of several neighboring anodes, which thereby improves the spectral resolution and count rate of a semiconductor detector.

17 Claims, 2 Drawing Sheets

ELECTRICAL ISOLATION OF X-RAY SEMICONDUCTOR IMAGER PIXELS

FIELD OF THE INVENTION

The present invention relates to a semiconductor detector, particularly to a medical semiconductor detector.

BACKGROUND OF THE INVENTION

In medical industry, direct conversion materials, such as Si, GaAs, CdTe, and CZT gain more and more importance in modalities, such as CT detectors, X-ray detectors, Gamma detectors, and nuclear medicine in which the scintillator type detectors are still state of the art. Their advantage over scintillators is the possibility of photon-counting coupled with a good energy solution. However, these direct conversion materials are vulnerable because of charge sharing, a phenomenon in which the charge cloud generated by a single photon is collected by several neighboring electrodes. FIG. 1 shows that a charge cloud generated by one photon is collected by three neighboring electrodes. The phenomenon of charge sharing disturbs the spectral resolution and count rate performance of detectors. In high-rate detectors, the phenomenon of charge sharing limits the effort of adopting smaller pixels. At the same time, the phenomenon of K-escape also limits the adoption of smaller pixel sizes. K-escape is primarily caused by partial transport of the primary energy, e.g. X-ray energy, through another quantum, e.g. an X-ray quantum, to a neighboring pixel.

Thus there is a need to solve or mitigate the negative influence of charge sharing, especially in detectors based on direct conversion materials.

SUMMARY OF THE INVENTION

It is an object of the present invention to provide an improved semiconductor detector.

In one embodiment, it is advantageous to mitigate the negative effect caused by charge sharing and thereby improve the spectral resolution and count rate performance of semiconductor detectors.

In one embodiment, it is advantageous to mitigate, or even eliminate the K-escape phenomenon of semiconductor detectors and thereby improve the count rate performance of semiconductor detectors.

In one embodiment, it is advantageous to mitigate the negative effect of charge sharing and K-escape on the miniaturization of pixel sizes of semiconductor detectors.

In a first aspect, according to one embodiment of the invention, a semiconductor detector is provided, comprising: a plurality of anodes arranged to form at least one opening, each opening being formed by two anodes in the plurality of anodes; at least one cathode; a detector cell located between the plurality of anodes and the at least one cathode; wherein the detector cell comprises at least one groove, each of the at least one groove having a first opening aligned with one of the at least one opening being formed by two anodes in the plurality of anodes, each of the at least one groove extending towards the at least one cathode. Forming one or more grooves in the detector cell is efficient to guide the charge cloud generated by a single photon received by a corresponding anode, instead of being received by several neighboring anodes. This provides the advantage of mitigating the negative effect of charge sharing on spectral resolution and count rate performance.

In a further embodiment, each groove extends along a direction perpendicular to the plane of its first opening. In other words, each groove is perpendicular to the tangential plane of a corresponding opening formed by two corresponding adjacent anodes. It is easy to manufacture this shape of groove.

In another embodiment, each groove extends along a direction away from a direction which is perpendicular to the plane of its first opening. In other words, the direction of extension of the groove is inclined instead of being perpendicular to the tangential plane of a corresponding opening formed by two corresponding adjacent anodes. This shape is advantageous in that it decreases the phenomenon of reducing DQE (Detector Quantum Efficiency) of detectors.

In a second aspect, according to one embodiment of the invention, each groove comprises an insulator which is helpful in mitigating, or even eliminating, the negative effect of the K-escape phenomenon. It is preferred to use insulator with a high atomic number Z.

These and other aspects, features and/or advantages of the invention are apparent from and will be elucidated with reference to the embodiments described hereinafter.

DESCRIPTION OF EMBODIMENTS

Figure 1:
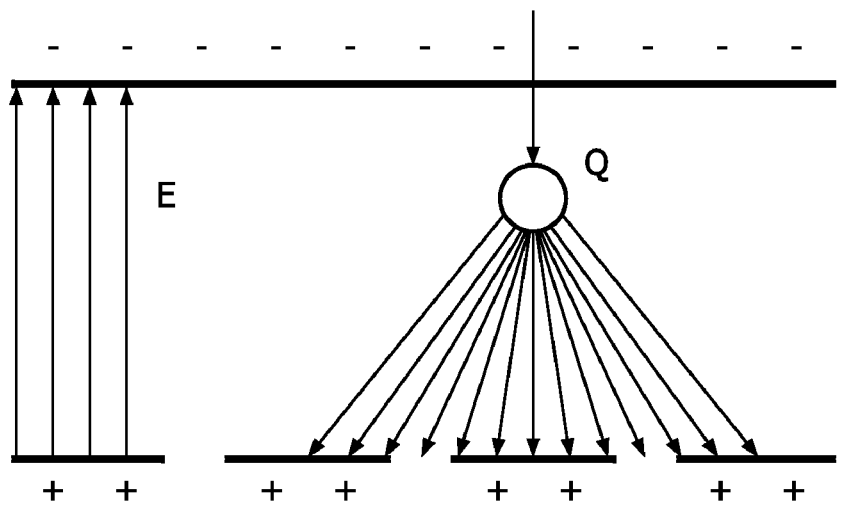
FIG. 1 illustrates the phenomenon of charge sharing.
Figure 2:
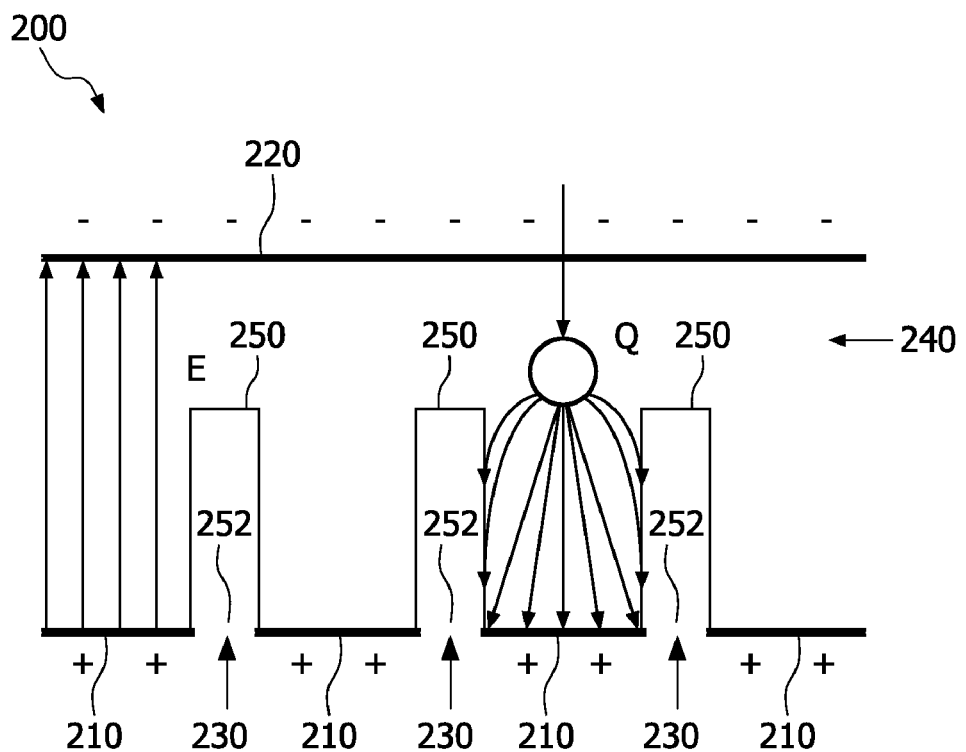
FIG. 2 illustrates a semiconductor detector comprising grooves perpendicular to the surface of a plurality of anodes, according to one embodiment of the invention.

An embodiment of a structured semiconductor detector which mitigates or overcomes the drawback of the charge sharing effect in current semiconductor detectors is shown in FIG. 2. The detector 200 comprises a plurality of anodes 210, at least one cathode 220, and a detector cell 240. The anodes and the at least one cathode can be arranged in parallel, or in another configuration. Every two adjacent anodes form an opening 230. From each opening, a groove 250 extends into the detector cell 240, with its direction perpendicular to the plane of the opening 230. Each groove 250 has a first opening 252, which may have the same width as the corresponding opening 230, or which may be larger/smaller than the corresponding opening 230. It can clearly be seen that, due to the existence of grooves, a charge cloud generated by a photon is received by one corresponding anode instead of by two or more adjacent anodes.

Figure 3:
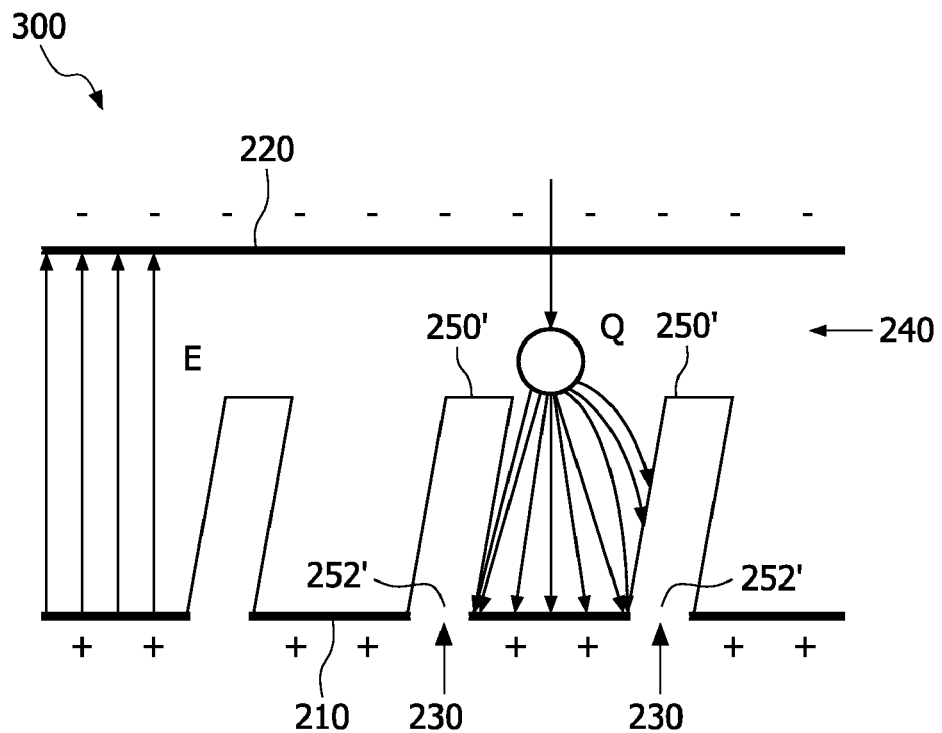
FIG. 3 illustrates a semiconductor detector comprising grooves extending along a tilt angle away from the perpendicular direction of a plurality of anodes, according to one embodiment of the invention.

Another embodiment is shown in FIG. 3, in which the direction of extension of the grooves is not perpendicular to the plane of the opening 230, i.e. the plane of the first opening 252' of each groove. Each groove 250', or at least part of the grooves, extends along a tilt direction which is not perpendicular to the opening 230, i.e. its first opening 252'. The drawback of a reduced DQE (Detector Quantum Efficiency) caused by a reduced stopping power can be mitigated with the tilt direction. The angle of the extending direction of the grooves 250' may vary in dependence on some factors, including mechanical stability, stopping power, density and thickness of the sensor material, and also the X-ray spectrum used. The skilled person can adapt the angle of the extending direction to the real situation. Optionally, the thickness of the detector cell 240, e.g. the crystal used, can be slightly increased.

In the embodiments of FIG. 2 and FIG. 3, the depth of grooves may vary in dependence on demands and/or manufacturing techniques. The grooves may extend slightly into the detector cell 240, halfway into the detector cell 240, or even extend from the opening 230 to the plane of the cathode. In the latter case, the groove has a second opening located at the surface of the cathode.

The embodiments shown in FIG. 2 and FIG. 3 can be combined in any configuration. For example, it is allowed to combine part of the grooves extending along a direction perpendicular to the plane of their first opening 252 and part of the grooves extending along tilt directions away from the perpendicular direction of the plane of their first opening 252, respectively. Especially for the part of the detector cell which is rather blind to the incoming photons, e.g. X-ray photons, the grooves extend along the perpendicular direction. For the other part of the detector cell, the grooves extend along tilt directions, which is advantageous for improving the DQE.

Figure 4:
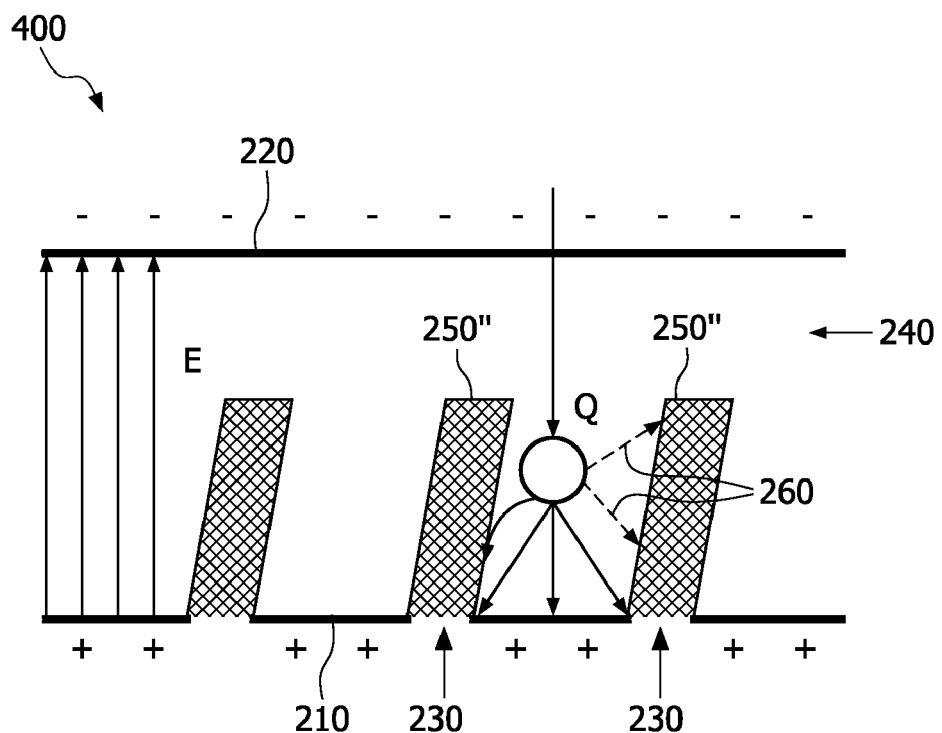
FIG. 4 illustrates a semiconductor detector comprising grooves filled by insulators, according to one embodiment of the invention.

K-escape is caused by a photo-effect releasing a K-shell electron from an atom in the detector cell, with the K-shell being refilled almost instantly from a higher shell electron and thereby releasing a characteristic amount of energy in the form of a K-escape photon. This photon can be transported from one place to another in the detector cell and may give rise to another signal elsewhere in the detector. FIG. 4 illustrates an embodiment according to the present invention, which mitigates/eliminates the K-escape phenomenon. Each groove 250" is filled with an insulator which can effectively stop this migrating energy, i.e. K-escape photons, denoted by reference numeral 260, and can thus suppress or even prevent the production of disturbing signals. Optionally, the insulator is made of an insulating material with a high atomic number Z.

The embodiments of the semiconductor detector shown in FIGS. 2 to 4 can be used in medical equipment, at least including CT scanners, X-ray detectors and Gamma-ray detectors.

The embodiments shown in FIGS. 2 to 4 can be combined in any configuration. Although the present invention has been described with reference to the specified embodiments, it is not intended to be limited to the specific form set forth herein. Rather, the scope of the present invention is limited only by the accompanying claims. In the claims, use of the verb "comprise" and its conjugations does not exclude the presence of other elements or steps. Although individual features may be included in different claims, these may possibly be combined advantageously, and the inclusion in different claims does not imply that a combination of features is not feasible and/or advantageous. In addition, singular references do not exclude a plurality. Furthermore, reference signs in the claims shall not be construed as limiting the scope.

The invention claimed is:

1. A semiconductor detector comprising:
a plurality of anodes arranged to form at least one anode opening, each anode opening being formed by two anodes in the plurality of anodes;
at least one cathode; and
a detector cell located between the plurality of anodes and the at least one cathode;
wherein the detector cell comprises one or more grooves, each of the grooves having a first opening aligned with one of the anode openings and defining a plane, such that each of the grooves has a longitudinal axis extending towards the at least one cathode; and
wherein for each of the grooves, the first opening plane is not perpendicular to the longitudinal axis.

2. The semiconductor detector according to claim 1, wherein each of the grooves has a second opening aligned with a surface of the at least one cathode.

3. The semiconductor detector according to claim 1, wherein each of the grooves comprises an insulator.

4. The semiconductor detector according to claim 3, wherein the insulator is made of a material having a high atomic number Z.

5. The semiconductor detector according to claim 1, wherein the detector cell is made of a direct conversion material.

6. The semiconductor detector according to claim 1, further configured to detect x-ray quanta.

7. The semiconductor detector according to claim 1, wherein each of the grooves has one or more sidewall surfaces surrounding the longitudinal axis of the groove, and each groove sidewall surface is parallel to the longitudinal axis of the groove.

8. The semiconductor detector according to claim 1, wherein the detector cell further comprises one or more second grooves, each of the second grooves has a first opening aligned with one of the anode openings and defining a plane, such that each of the second grooves has a longitudinal axis extending towards the at least one cathode, and wherein, for each the second grooves, the first opening plane is perpendicular to the longitudinal axis.

9. A medical scanner comprising a semiconductor detector, wherein the semiconductor detector comprises:
a plurality of anodes arranged to form at least one anode opening, each anode opening being formed by two anodes in the plurality of anodes;
at least one cathode; and
a detector cell located between the plurality of anodes and the at least one cathode;
wherein the detector cell comprises one or more grooves, each of the grooves having a first opening aligned with one of the anode openings and defining a plane, such that each of the grooves has a longitudinal axis extending towards the at least one cathode; and
wherein, for each of the grooves, the first opening plane is not perpendicular to the longitudinal axis.

10. A medical scanner according to claim 9, being any one of a CT scanner, an X-ray detector, and a Gamma-ray detector.

11. A medical scanner according to claim 9, wherein each of the grooves has one or more sidewall surfaces surrounding the longitudinal axis of the groove, and each groove sidewall surface is parallel to the longitudinal axis of the groove.

12. A medical scanner according to claim 9, wherein the detector cell further comprises one or more second grooves, each of the second grooves has a first opening aligned with one of the anode openings and defining a plane, such that each of the second grooves has a longitudinal axis extending towards the at least one cathode, and wherein, for each of the second grooves, the first opening plane is perpendicular to the longitudinal axis.

13. A medical scanner according to claim 9, wherein each of the grooves has a second opening aligned with a surface of the at least one cathode.

14. A medical scanner according to claim 9, wherein each of the grooves comprises an insulator.

15. A medical scanner according to claim 14, Wherein the insulator is made of a material having a high atomic number Z.

16. A medical scanner according to claim 9, wherein the detector cell is made of a direct conversion material.

17. A medical, scanner according to claim 9, further configured to detect x-ray quanta.

* * * * *